United States Patent [19]
Eslambolchi et al.

[11] Patent Number: 5,973,604
[45] Date of Patent: *Oct. 26, 1999

[54] METHOD FOR MONITORING OPTICAL FIBER CABLES FOR LIGHTNING DAMAGE

[75] Inventors: Hossein Eslambolchi, Basking Ridge, N.J.; John Sinclair Huffman, McDonough, Ga.

[73] Assignee: AT&T Corp., New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/738,511

[22] Filed: Oct. 28, 1996

[51] Int. Cl.⁶ .................................................. G08B 21/00
[52] U.S. Cl. ......................... 340/635; 340/657; 340/658; 340/660; 340/661; 340/662; 324/102; 324/113; 356/73.1

[58] Field of Search .................................... 340/635, 657, 340/658, 660, 661, 662; 324/113, 102, 133; 356/73.1; 379/2

[56] References Cited
U.S. PATENT DOCUMENTS

| | | | |
|---|---|---|---|
| 3,149,243 | 9/1964 | Garfield | 340/658 |
| 4,105,966 | 8/1978 | Lennon et al. | 324/113 |
| 4,197,435 | 4/1980 | Jackson et al. | 179/175 |

*Primary Examiner*—Julie Lieu
*Attorney, Agent, or Firm*—Robert B. Levy

[57] ABSTRACT

Lightning strikes on or proximate to an optical fiber cable may be detected via a lightning detector (18) that monitors the characteristics of voltage present on a metallic sheath (12) associated with the cable. The lightning detector (18) detects excessive voltage levels, spikes and/or frequency variations associated with a lightning strike and generates an alarm signal communicated to a central monitoring facility.

3 Claims, 1 Drawing Sheet

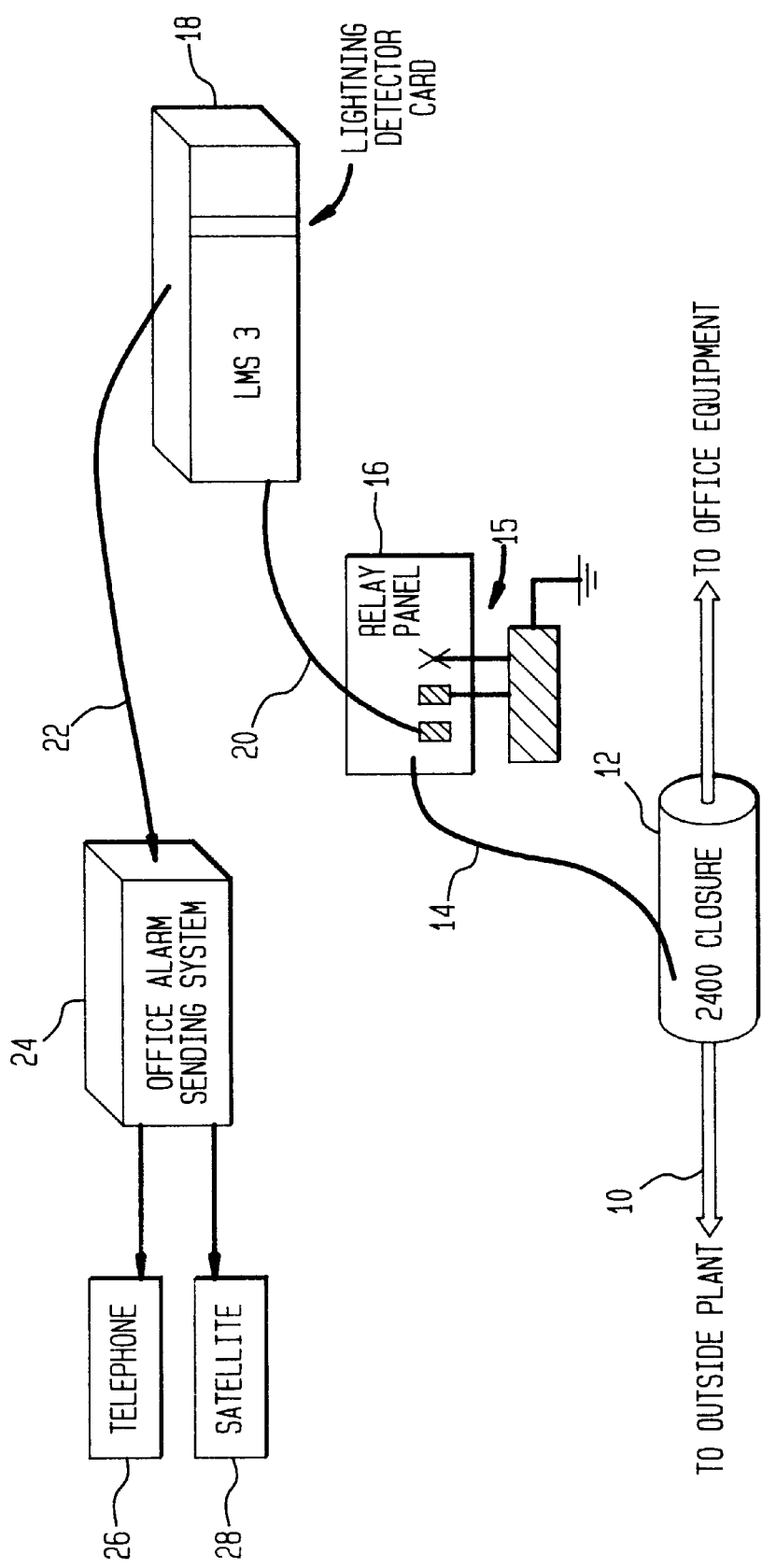

METHOD FOR MONITORING OPTICAL FIBER CABLES FOR LIGHTNING DAMAGE

TECHNICAL FIELD

This invention relates to a technique for detecting lightning damage to an optical fiber cable.

BACKGROUND ART

Providers of telecommunications services, such as AT&T, utilize various types of transmission media, including optical fiber cable. As compared to copper cables, optical fiber cables afford greater bandwidth and reduced susceptibility to electromagnetic interference. These advantages of optical fiber cables have prompted telecommunication service providers to employ optical fiber cables whenever possible, especially for trunk applications between facilities.

To protect optical fiber cables against damage, many telecommunications providers bury their optical fiber cables underground. While underground burial protects optical fiber cables from many kinds of damage, burial does not necessarily shield cables from environmental hazards, such as lightning damage. Indeed, optical fiber cables tend to be very susceptible to lightning strikes.

During the spring and summer months, storms occur frequently during which lightning may strike the earth thousands of time. Many lightning strikes often occur near buried optical fiber cables, leading to minor or even major cable damage. Detecting major cable damage, and repairing it can consume many hours. Detecting minor cable damage may be very difficult. As a result, such damage may go undetected. If lightning does strike an optical fiber cable, the lightning will likely travel along a metallic shield or sheath within the cable to a facility where the cable terminates, such as a central office, for example. The receipt of a lightning strike at a piece of equipment within the central office may cause the equipment to fail. Equipment failure due to lightning may lead to a failure of associated alarm reporting systems, making the loss of the equipment difficult to detect, especially at remote facilities that are unmanned.

Thus there is a need for a technique for detecting the presence of a lightning strike on or near an optical fiber cable.

BRIEF SUMMARY OF THE INVENTION

Briefly, in accordance with the invention, a technique is provided for detecting lightning strikes that may damage an optical fiber cable, as well as any equipment connected to the cable. To detect the presence of a lightning strike on an optical fiber, voltage on a metallic sheath surrounding the cable is monitored. We have found that lightning strikes on, or proximate to an optical fiber cable produce excessive voltage, voltage spikes, and/or voltages having various frequencies on the cable sheath. The characteristics of the monitored voltage (particularly, the level of the voltage and its frequency) are compared to threshold values representing quiescent operating conditions. If any of the characteristics of the monitored voltage deviates by an amount representative of a lightning strike, then such a condition is signaled via an alarm signal. In this way, damaging lightning strikes can be detected.

BRIEF DESCRIPTION OF THE DRAWING

FIG. 1 is a block schematic diagram of a system, in accordance with the invention, for monitoring an optical fiber cable to detect for lightning strikes on or proximate to the cable.

DETAILED DESCRIPTION

FIG. 1 depicts an optical fiber cable 10 of the type commonly employed to carry optically-formatted telecommunications signals from an outside plant facility, such as a subscriber loop carrier system (not shown) to an office facility for processing by one or more pieces of equipment, such as a switching system (not shown). Typically, a metallic sheath or enclosure 12 is associated with the cable. A metallic conductor 14 couples the sheath 12 to an office ground system 15 within the office facility. The office ground system includes a relay panel 16 that couples the cable sheath 12 to earth. Normally, lightning striking the cable sheath 14 passes to the office ground system 15 and is shunted to ground via the relay panel 16.

However, it is not unusual for lightning to travel to the office ground system 15 and then jump to one or more pieces of equipment (not shown) despite the connection of such equipment to the ground system 15. Lightning that jumps beyond the ground system 15 to a piece of equipment often causes damage thereto. Indeed, despite the grounding of the cable sheath 12 by the office ground system 15, a lightning strike on or proximate the sheath may damage the optical fiber cable 10 as well. Often lightning damage to the optical fiber cable 12, and the equipment to which it is connected may go unnoticed because the office in which such equipment is situated is unmanned. While the equipment within the office is often monitored by an alarm, a lightning strike may disable such an alarm, making any malfunction of the equipment difficult to detect.

In accordance with the invention, lightning strikes on or proximate to the optical fiber cable 12 are advantageously detected by a lightning detector 18 that is coupled by a cable 20 to the relay panel 16 to monitor the voltage on the cable sheath 12. We have found that lightning strikes on or proximate to the cable 10 produce excessive voltage, voltage spikes, and/or voltages having various frequencies on the cable sheath. To that end, the lightning detector 18 monitors the voltage, if any, on the cable sheath 12 to detect any voltage abnormalities (in terms of level and/or frequency) characteristic of a lightning strike.

In practice, the lightning detector 18 includes a voltage comparator (not shown) for comparing the level of the sheath voltage. Any deviation in the level of the voltage on the cable sheath 12 (including a voltage spike) that deviates by a prescribed tolerance value from the level associated with a quiescent operating condition represents a possible lightning strike. Hence, under such conditions, the lightning detector 18 will generate an output signal that indicates a possible lightning strike. Additionally, the lightning detector 18 may include a frequency comparator (not shown) for monitoring the frequency of the voltage on the cable sheath 12 in much the same way that the voltage level is monitored to detect variations associated with a possible lightning strike. The frequency comparator, which may be integral with, or separate from, the voltage comparator, has its output paralleled that of the voltage comparator. In this way, the lightning detector 18 generates an output signal indicative of the lightning strike when the frequency of the voltage on the cable sheath deviates by a prescribed tolerance factor from the quiescent frequency of the voltage on the cable.

The output signal of the lightning detector 18 passes by way of a cable 22 to a sending alarm system 24. The sending alarm system 24 could be as simple as an oscillator that generates a tone indicative of an alarm condition. Alternatively, the alarm system 24 could comprise circuitry that would generate either an analog or digital signal that was encoded in some manner so as to identify the particular cable 10, as well the office at which the cable terminates. Information specifically identifying the cable 10 as well as its terminating office is very useful to repair personnel as allows such personnel to effect repairs more quickly.

The alarm signal generated by the alarm system 24 may be communicated to a central monitoring location by either a telephone link 26 or a satellite link 28 whereupon repair personnel are dispatched to investigate and perform any necessary repairs. In some instances, it may be useful to employ both the telephone link 26 and the satellite link 28 rather than one or the other. Using both types of links provides for redundancy in the event that one of the links is inoperative.

The foregoing describes a technique for detecting possible lightning strikes on or in proximity to, an optical fiber (10) by monitoring the characteristics of the voltage on the sheath (12) surrounding the cable.

What is claimed is:

1. A method for detecting a lightning strike on or near an optical fiber cable having a metallic sheath, comprising the steps of:

monitoring a frequency of a voltage that present on the cable sheath;

comparing the frequency to a frequency associated with a quiescent operating condition;

generating an alarm condition if said frequency differs by a prescribed tolerance factor from said frequency associated with the quiescent operating condition; and communicating the alarm condition to a central monitoring facility.

2. The method according to claim 1 wherein the monitoring step includes the step of monitoring both frequency and voltage level.

3. The method according to claim 2 wherein the wherein the alarm condition is generated if either the frequency or the voltage level differs by a corresponding prescribed tolerance factor from the frequency and voltage level, respectively, associated with the quiescent operating condition.

* * * * *